(12) United States Patent
Moriya et al.

(10) Patent No.: US 7,948,009 B2
(45) Date of Patent: May 24, 2011

(54) NITRIDE SEMICONDUCTOR EPITAXIAL WAFER AND NITRIDE SEMICONDUCTOR DEVICE

(75) Inventors: Yoshihiko Moriya, Hitachi (JP); Takeshi Tanaka, Tokai (JP); Yohei Otoki, Hitachi (JP); Masae Sahara, Takahagi (JP)

(73) Assignee: Hitachi Cable, Ltd., Tokyo (JP)

( * ) Notice: Subject to any disclaimer, the term of this patent is extended or adjusted under 35 U.S.C. 154(b) by 93 days.

(21) Appl. No.: 12/382,481

(22) Filed: Mar. 17, 2009

(65) Prior Publication Data
US 2009/0236634 A1    Sep. 24, 2009

(30) Foreign Application Priority Data

Mar. 18, 2008 (JP) ................. 2008-069133

(51) Int. Cl.
*H01L 31/072* (2006.01)
*H01L 31/109* (2006.01)
*H01L 31/0328* (2006.01)
*H01L 31/0336* (2006.01)

(52) U.S. Cl. ............................ 257/190; 257/79; 438/47

(58) Field of Classification Search .................... 257/79, 257/190, E29.091; 438/47
See application file for complete search history.

(56) References Cited

U.S. PATENT DOCUMENTS
6,989,287 B2 *  1/2006  Fujikura et al. ................ 438/47
2006/0169987 A1 *  8/2006  Miura et al. .................... 257/79

FOREIGN PATENT DOCUMENTS
JP         2006-351870         12/2006

* cited by examiner

*Primary Examiner* — Phuc T Dang
(74) *Attorney, Agent, or Firm* — McGinn IP Law Group, PLLC (57) ABSTRACT

A nitride semiconductor epitaxial wafer includes a growth substrate including a surface for growing a nitride semiconductor thereon, a first structure layer formed on the growth substrate, a dislocation propagation direction changing layer formed on the first structure layer for changing a propagation direction of a dislocation propagated in the first structure layer into a lateral direction, a second structure layer formed on the dislocation propagation direction changing layer, and a buffer layer formed on the second structure layer for changing a propagation direction of a dislocation propagated in the second structure layer.

13 Claims, 6 Drawing Sheets

NITRIDE SEMICONDUCTOR EPITAXIAL WAFER AND NITRIDE SEMICONDUCTOR DEVICE

The present application is based on Japanese Patent Application No. 2008-069133 filed on Mar. 18, 2008, the entire contents of which are incorporated herein by reference.

BACKGROUND OF THE INVENTION

1. Field of the Invention

The present invention relates to a nitride semiconductor epitaxial wafer and, in particular, to a nitride semiconductor epitaxial wafer with reduced threading dislocation, and a nitride semiconductor device fabricated by using the nitride semiconductor epitaxial wafer.

2. Related Art

A conventional nitride semiconductor epitaxial wafer is known in which a first buffer layer of $Al_xGa_{1-x}N$, a second buffer layer of AlN, a third buffer layer of GaN, a channel layer of GaN and a supply layer of AlGaN are sequentially formed on a sapphire substrate in this order (e.g., JP-A-2006-351870).

In the nitride semiconductor epitaxial wafer of JP-A-2006-351870, since the first buffer layer of $Al_xGa_{1-x}N$ is provided between the sapphire substrate and the second buffer layer, it is possible to reduce warping of the nitride semiconductor epitaxial wafer and to provide a device with low ohmic resistance.

However, the nitride semiconductor epitaxial wafer of JP-A-2006-351870 has a problem as below.

The buffer layers are formed on the hetero-substrate for reducing dislocations generated in the epitaxial growth layer due to difference in lattice constant and in thermal expansion coefficient between the hetero-substrate and the epitaxial growth layer. Nevertheless, the threading dislocations cannot be sufficiently reduced, so that they may cause leak current when the wafer is used to fabricate a high-frequency nitride semiconductor transistor. Therefore, the nitride semiconductor epitaxial wafer of JP-A-2006-351870 is not suitable for the high-frequency nitride semiconductor transistor which requires low leak current. Thus, the threading dislocation thereof is desired to be further reduced.

SUMMARY OF THE INVENTION

It is an object of the invention to provide a nitride semiconductor epitaxial wafer that achieves a reduction in threading dislocation and leak current and is, therefore, suited to fabricate a high-frequency nitride semiconductor transistor.

(1) According to one embodiment of the invention, a nitride semiconductor epitaxial wafer comprises:

a growth substrate comprising a surface for growing a nitride semiconductor thereon;

a first structure layer formed on the growth substrate;

a dislocation propagation direction changing layer formed on the first structure layer for changing a propagation direction of a dislocation propagated in the first structure layer into a lateral direction;

a second structure layer formed on the dislocation propagation direction changing layer; and a buffer layer formed on the second structure layer for changing a propagation direction of a dislocation propagated in the second structure layer.

In the above embodiment (1), the following modifications and changes can be made.

(i) The first and second structure layers each comprises a three-dimensional structure, and the dislocation propagation direction changing layer and the buffer layer each change the propagation direction of the dislocation at a surface of the three-dimensional structure.

(ii) The dislocation propagation direction changing layer is grown in the lateral direction.

(iii) The first structure layer is formed 5 nm to 50 nm in thickness, and the second structure layer is formed 5 nm to 50 nm in thickness.

(iv) The dislocation propagation direction changing layer is formed less than 100 nm in thickness.

(v) The first structure layer comprises AlN, the dislocation propagation direction changing layer comprises GaN, the second structure layer comprises a nitride semiconductor containing aluminum (Al), and the buffer layer comprises GaN.

(vi) The second structure layer comprises $Al_xGa_{(1-x)}N$ ($0<x\leq1$), and the dislocation propagation direction changing layer comprises GaN.

(vii) The growth substrate comprises a SiC or GaN single crystal.

(viii) The second structure layer comprises an $Al_xGa_{(1-x)}N$ ($0<x\leq1$) composition change layer that Al composition ratio thereof decreases in a direction from the dislocation propagation direction changing layer to the buffer layer.

(ix) Two laminate structures, each of which comprising a lamination of the dislocation propagation direction changing layer and the second structure layer, are formed between the first structure layer and the buffer layer.

(x) The dislocation propagation direction changing layer comprises InGaN or AlGaN.

(2) According to another embodiment of the invention, a nitride semiconductor epitaxial wafer comprises:

a growth substrate comprising a surface for growing a nitride semiconductor thereon and a SiC or GaN single crystal;

a first structure layer formed on the growth substrate and comprising AlN and a three-dimensional structure;

a dislocation propagation direction changing layer comprising GaN and formed directly on the first structure layer for changing a propagation direction of a dislocation propagated in the first structure layer into a lateral direction;

a second structure layer formed on the dislocation propagation direction changing layer and comprising AlN and a three-dimensional structure;

a buffer layer comprising GaN and formed on the second structure layer for changing a propagation direction of a dislocation propagated in the second structure layer;

a channel layer formed on the buffer layer; and a supply layer formed on the channel layer.

In the above embodiment (1) or (2), the following modifications and changes can be made.

(xi) A nitride semiconductor device comprises the nitride semiconductor epitaxial wafer as defined above and an electrode formed thereon.

BRIEF DESCRIPTION OF THE DRAWINGS

Next, the present invention will be explained in more detail in conjunction with appended drawings, wherein.

DESCRIPTION OF THE PREFERRED EMBODIMENTS

First Embodiment

Figure 1:
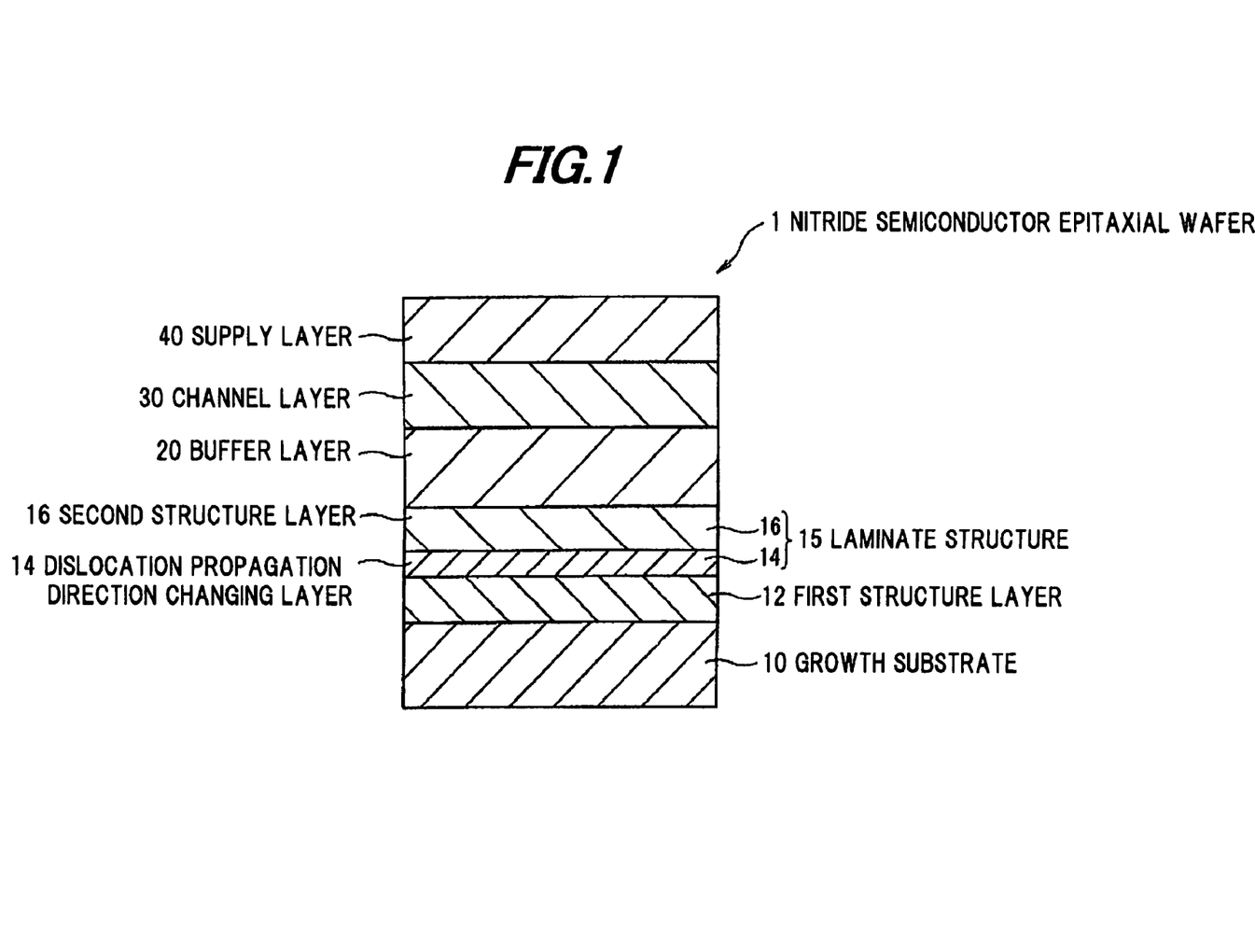
FIG. 1 is a schematic cross sectional view showing a nitride semiconductor epitaxial wafer in a first preferred embodiment of the invention.

FIG. 1 is a schematic cross sectional view showing a nitride semiconductor epitaxial wafer in a first preferred embodiment of the invention.

A nitride semiconductor epitaxial wafer 1 of the first embodiment is composed of a growth substrate 10 formed of a single crystal and having a surface for growing a nitride semiconductor, a first structure layer 12 formed on the growth substrate 10, a dislocation propagation direction changing layer 14 formed on the first structure layer 12 for changing the propagation direction of dislocation along the growth direction, a second structure layer 16 formed on the dislocation propagation direction changing layer 14, a buffer layer 20 formed on the second structure layer 16, a channel layer 30 formed on the buffer layer 20, and a supply layer 40 formed on the channel layer 30.

A laminate structure 15 is composed of the dislocation propagation direction changing layer 14 and the second structure layer 16. The first structure layer 12, the laminate structure 15, the buffer layer 20, the channel layer 30 and the supply layer 40 which are epitaxially grown on the growth substrate 10, are formed by MOCVD (metal organic chemical vapor deposition) etc.

The growth substrate 10 is formed of a material having a predetermined lattice constant and a predetermined thermal expansion coefficient, and has a surface for epitaxially growing a nitride semiconductor such as GaN, AlGaN, AlN etc. The growth substrate 10 is formed of a material that is within a predetermined difference in lattice constant and in thermal expansion coefficient from a nitride semiconductor to be epitaxially grown on the surface thereof. For example, the growth substrate 10 may be a sapphire substrate, a semi-insulating SiC substrate, an n-type SiC substrate or a GaN substrate.

The first structure layer 12 is formed including a three-dimensional structure on the growth substrate 10. For example, the first structure layer 12 includes a facet (or a quantum dot) as a three-dimensional structure formed by three-dimensionally growing a predetermined nitride semiconductor on the growth substrate 10. By forming the first structure layer 12 including the three-dimensional structure on the growth substrate 10, a nitride semiconductor layer formed on the first structure layer 12 is promoted in growth (i.e., lateral growth) thereof along the horizontal direction of the surface of the growth substrate 10. The first structure layer 12 is formed, e.g., 50 nm or less which corresponds to such a thickness that a condition having the three-dimensional structure can be retained (i.e., a thickness that flattening of the first structure layer 12 does not occur). Further, in order to function as a high-resistivity layer, the first structure layer 12 may be formed of, e.g., i-AlN as a material for providing a high-resistivity layer.

When a sapphire substrate is used as the growth substrate 10, the first structure layer may be thickened (e.g., not less than 350 nm and not more than 1 μm in thickness), or, after growing a predetermined buffer layer on the sapphire substrate, the first structure layer 12 of this embodiment may be formed on the buffer layer. Otherwise, when the first structure layer 12 including the three-dimensional structure is directly formed on the growth substrate 10, the growth substrate 10 may be a semi-insulating SiC substrate, an n-type SiC substrate or a GaN substrate.

The dislocation propagation direction changing layer 14 is formed by laterally growing a predetermined nitride semiconductor on the first structure layer 12. The dislocation propagation direction changing layer 14 servers to change the propagation direction of dislocations generated on the surface of the three-dimensional structure of the first structure layer 12 during the epitaxial growth. For example, the dislocation propagation direction changing layer 14 converts the propagation direction of dislocation generated during the crystal growth into the growth direction (i.e., lateral direction). On the three-dimensional structure, the dislocation propagation direction changing layer 14 is grown mainly in the lateral direction, so that the dislocation propagated in the dislocation propagation direction changing layer 14 also propagates in the lateral direction along the growth direction. Thereby, the dislocations propagated in the dislocation propagation direction changing layer 14 grown on the adjacent three-dimensional structures collide with each other to prevent the dislocation propagation. Furthermore, since the propagation direction of the dislocations is converted into the lateral direction, the dislocations can be prevented from propagating toward the surface direction (i.e., the normal direction of the growth substrate 10) of the epitaxial layer.

When the nitride semiconductor epitaxial wafer 1 of the first embodiment is composed of the growth substrate 10 formed of a semi-insulating single crystal substrate and is used for making a high-frequency nitride semiconductor transistor etc., the thickness of the dislocation propagation direction changing layer 14 is set as follows. Namely, the thickness is set such that two-dimensional electron gas is not generated at the interface between the first structure layer 12 and the dislocation propagation direction changing layer 14 and at the interface between the dislocation propagation direction changing layer 14 and the second structure layer 16 formed thereon.

Thus, the dislocation propagation direction changing layer 14 is thinned in order to prevent the generation of the two-dimensional electron gas due to the effects of band-offset, spontaneous polarization and piezoelectric polarization between the first structure layer 12 and the dislocation propagation direction changing layer 14 and between the dislocation propagation direction changing layer 14 and the second structure layer 16. Thereby, the characteristics of the first structure layer 12 and the second structure layer 16 are imparted to a portion of the dislocation propagation direction changing layer 14 in proximity to the interface between the dislocation propagation direction changing layer 14 and the first structure layer 12, and to the interface between the dislocation propagation direction changing layer 14 and the second structure layer 16. For example, the dislocation propagation direction changing layer 14 is formed not less than 1 nm and not more than 100 nm in thickness. When the thickness of the dislocation propagation direction changing layer 14 is formed such that two-dimensional electron gas is not generated, parasitic capacitance can be reduced in making a high-frequency nitride semiconductor transistor etc.

In contrast, when the growth substrate 10 is formed of an n-type single crystal substrate, the dislocation propagation direction changing layer 14 may be thicker than the thickness that two-dimensional electron gas can be generated at the interface between the dislocation propagation direction changing layer 14 and the second structure layer 16. Meanwhile, even when a p-type dopant layer is formed between the dislocation propagation direction changing layer 14 and the second structure layer 16 as described layer, the dislocation propagation direction changing layer 14 may have a thickness of more than 100 nm (preferably more than 100 nm and less than 250 nm). For example, the dislocation propagation direction changing layer 14 is formed of a nitride semiconductor such as GaN, e.g., i-GaN.

The second structure layer 16 is formed including a three-dimensional structure on the dislocation propagation direction changing layer 14. For example, the second structure layer 16 includes a facet (or a quantum dot) as a three-dimensional structure by three-dimensionally growing a predetermined nitride semiconductor on the dislocation propagation direction changing layer 14. By forming the second structure layer 16 including the three-dimensional structure on the dislocation propagation direction changing layer 14, a nitride semiconductor layer formed on the second structure layer 16 is promoted in growth (i.e., lateral growth) thereof along the horizontal direction of the surface of the growth substrate 10. The second structure layer 16 is formed, e.g., 50 nm or less which corresponds to such a thickness that a condition having the three-dimensional structure can be retained. Further, in order to function as a high-resistivity layer, the second structure layer 16 may be formed of a nitride semiconductor containing Al, e.g., i-AlN as a material for providing a high-resistivity layer.

Further, the second structure layer 16 may be an $Al_xGa_{(1-x)}N(0<x\leqq1)$ composition change layer that Al composition ratio thereof varies in a direction from the dislocation propagation direction changing layer 14 to the buffer layer 20. For example, the second structure layer 16 may be an $Al_xGa_{(1-x)}N(0<x\leqq1)$ graded layer that Al composition ratio thereof continuously varies in the direction from the dislocation propagation direction changing layer 14 to the buffer layer 20, or, an $Al_xGa_{(1-x)}N(0<x\leqq1)$ step-graded layer that Al composition ratio thereof stepwise varies in the direction from the dislocation propagation direction changing layer 14 to the buffer layer 20.

In detail, in order to suppress the generation of strain and threading dislocation at the interface between the second structure layer 16 and the buffer layer 20, the second structure layer 16 may be an $Al_xGa_{(1-x)}N(0<x\leqq1)$ composition change layer that Al composition ratio thereof decreases in the direction from the dislocation propagation direction changing layer 14 to the buffer layer 20. Namely, the second structure layer 16 may be formed such that it is formed of AlGaN in the vicinity of the dislocation propagation direction changing layer 14 and the Al composition continuously or stepwise decreases as approaching to the buffer layer 20.

The buffer layer 20 is formed on the second structure layer 16 and serves to change the propagation direction of dislocation, which propagated through the second structure layer 16. The buffer layer 20 may be formed of, e.g., i-GaN, a nitride semiconductor. Similarly to the dislocation propagation direction changing layer 14, the buffer layer 20 changes the propagation direction of dislocation on the surface of the three-dimensional structure of the second structure layer 16. In other words, even when a dislocation propagated in the second structure layer 16 in the normal direction of the growth substrate without being converted in propagation direction by the dislocation propagation direction changing layer 14 is propagated subsequently into the buffer layer 20, the propagation direction of such a dislocation can be changed into the lateral direction due to the buffer layer 20 laterally grown on the surface of the three-dimensional structure of the second structure layer 16. Thus, the dislocation can be effectively prevented from propagating in the normal direction of the growth substrate.

The channel layer 30 is epitaxially grown on the buffer layer 20. The channel layer 30 may be formed of, e.g., i-GaN. The supply layer 40 is formed of a material having resistivity higher than that of the channel layer, and is grown on the channel layer 30. The supply layer 40 may be formed of, e.g., i-AlGaN.

Alternatively, in the nitride semiconductor epitaxial wafer 1, an InGaN layer or AlGaN layer may be grown between the first structure layer 12 and the buffer layer 20 instead of the GaN layer for the dislocation propagation direction changing layer 14 grown on the first structure layer 12. In other words, the nitride semiconductor epitaxial wafer 1 can be provided with the dislocation propagation direction changing layer 14 formed of InGaN or AlGaN instead of the dislocation propagation direction changing layer 14 formed of GaN.

Since GaN has a wider bandgap than Si or GaAs, it can have a higher breakdown field strength than Si or GaAs. Therefore, a nitride semiconductor transistor formed of a nitride semiconductor such as GaN is suitable for a high voltage operation since the breakdown is less likely to occur even under high electric field. Further, since saturated electron velocity of GaN is higher than that of Si etc. even in high electric field region, it is more advantageous than Si etc. for a high-speed operation of a device such as a transistor etc. as well as for an application to a short-channel high-frequency device where high electric field is applied near the gate electrode. Therefore, the nitride semiconductor epitaxial wafer 1 of this embodiment is preferably composed of a nitride semiconductor such as GaN when it is intended for applications to high breakdown voltage, a high voltage operation and a high-frequency device.

Further, when a sapphire substrate is used as the growth substrate 10 and the first structure layer 12 is thickened, the surface of the first structure layer 12 (e.g., an AlN layer of about 350 nm or more) is flattened. In this case, a GaN layer as the dislocation propagation direction changing layer 14 is formed including the three-dimensional structure due to the difference in lattice constant (as well as the difference in stress such as surface tension generated based on the difference in lattice constant) between the AlN layer as the first structure layer 12 and the GaN layer as the dislocation propagation direction changing layer 14 formed on the first structure layer 12. Namely, the GaN layer is formed with the three dimensional structure. Then, the AlN layer as the second structure layer 16 formed on the three-dimensional GaN layer (i.e., the dislocation propagation direction changing layer 14) is, as in the GaN layer, formed with the three-dimensional structure taking the influence from the three-dimensional GaN layer since the GaN layer as a lower layer of the AlN layer (i.e., the second structure layer 16) is formed with the three-dimension structure. Thus, even when the sapphire substrate is used as the growth substrate 10, it is possible to obtain a nitride semiconductor epitaxial wafer having the same characteristics as the first embodiment.

As a modification in the case that a sapphire substrate is used as the growth substrate 10, a nitride semiconductor epitaxial wafer having the same characteristics as the first embodiment can be also made by, on a sapphire substrate, sequentially growing an AlN thin film layer as the first structure layer 12 with a thickness of about 30 nm, a GaN layer as the dislocation propagation direction changing layer 14, an AlN layer as the second structure layer 16 with a thickness of not less than 300 nm and not more than 1 µm, and a GaN buffer layer.

Figure 2:
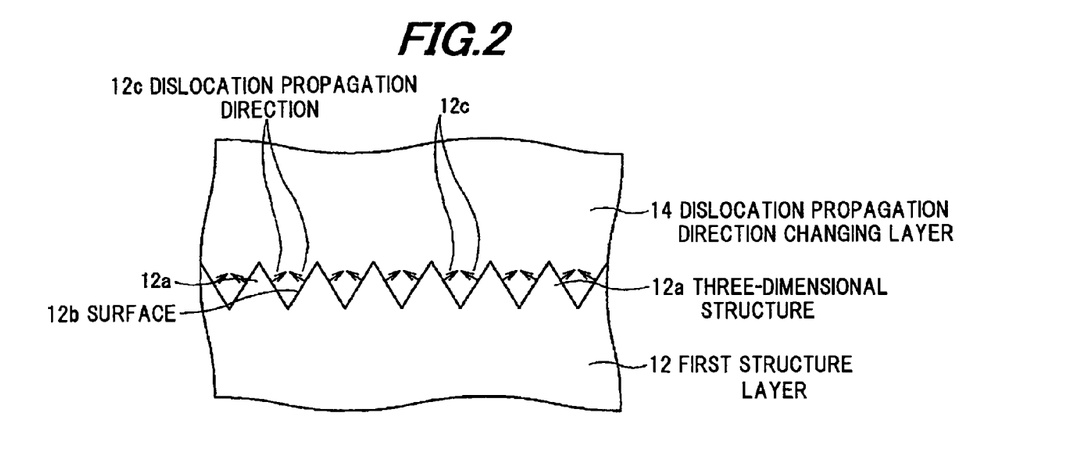
FIG. 2 is a schematic diagram illustrating growth of a dislocation propagation direction changing layer of the nitride semiconductor epitaxial wafer in the first embodiment.

FIG. 2 is a schematic diagram illustrating growth of the dislocation propagation direction changing layer of the nitride semiconductor epitaxial wafer in the first embodiment.

The first structure layer 12 is formed exposing a three-dimensional structure 12a at least on the surface thereof. The three-dimensional structure 12a is, e.g., a facet and has a surface 12b formed to have a predetermined angle with respect to the surface of the growth substrate 10. When the dislocation propagation direction changing layer 14 is formed on the first structure layer 12 having the three-dimensional structure 12a, a nitride semiconductor composing the dislocation propagation direction changing layer 14 is grown in the lateral direction from the three-dimensional structure 12a.

Then, according as the dislocation propagation direction changing layer 14 is grown in the lateral direction, the propagation direction of threading dislocations caused by the difference in lattice constant between the growth substrate 10 and the first structure layer 12 is also converted into the lateral direction, for example, into a dislocation propagation direction 12c as shown in FIG. 2. The propagation direction of threading dislocation is preferentially converted into the direction 12c perpendicular to the surface 12b formed at a predetermined angle with respect to the direction normal to the surface of the growth substrate 10. The same phenomenon as explained in FIG. 2 occurs also at the interface between the second structure layer 16 and the buffer layer 20.

Effects of the First Embodiment

According to the nitride semiconductor epitaxial wafer 1 in the first embodiment of the invention, since the lateral growth of the nitride semiconductor is promoted by the dislocation propagation direction changing layer 14 formed on the first structure layer 12, dislocation caused by the difference in lattice constant between the growth substrate 10 and the first structure layer 12 propagates laterally in the dislocation propagation direction changing layer 14. Thereby, it is possible to reduce the threading dislocation propagating toward the surface of the nitride semiconductor epitaxial wafer 1.

Further, according to the nitride semiconductor epitaxial wafer 1 in the first embodiment of the invention, since the second structure layer 16 is formed on the dislocation propagation direction changing layer 14, threading dislocation failed to be laterally converted by the dislocation propagation direction changing layer 14 can be propagated in the lateral direction. Thereby, it is possible to greatly reduce the threading dislocation propagating toward the surface of the nitride semiconductor epitaxial wafer 1, and to provide the flat nitride semiconductor epitaxial wafer 1 with reduced threading dislocation.

Further, according to the nitride semiconductor epitaxial wafer 1 in the first embodiment of the invention, since the first structure layer 12 and the second structure layer 16 can be formed of AlN as a high-resistivity material, it is possible to provide a high resistivity layer between the growth substrate 10 and the buffer layer 20. Thereby, it is possible to greatly reduce leak current.

Second Embodiment

Figure 3:
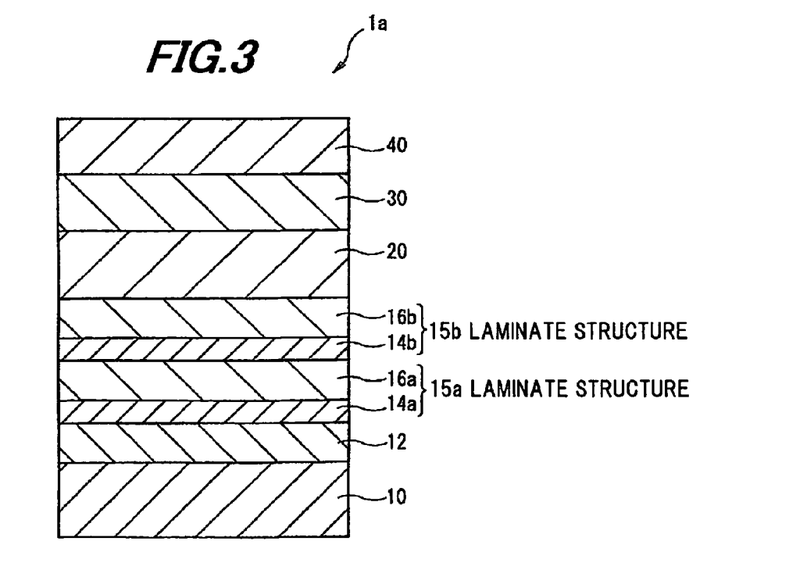
FIG. 3 is a schematic cross sectional view showing a nitride semiconductor epitaxial wafer in a second preferred embodiment of the invention.

FIG. 3 is a schematic cross sectional view showing a nitride semiconductor epitaxial wafer in the second preferred embodiment of the invention.

The nitride semiconductor epitaxial wafer 1a of the second embodiment is substantially the same as the nitride semiconductor epitaxial wafer 1 of the first embodiment, except the number of laminate structures composed of the dislocation propagation direction changing layer and the second structure layer. Thus, detailed explanations will be omitted below except the difference.

Between the first structure layer 12 and the buffer layer 20, the nitride semiconductor epitaxial wafer 1a of the second embodiment has a laminate structure 15a including a dislocation propagation direction changing layer 14a and a second structure layer 16a, and a laminate structure 15b including a dislocation propagation direction changing layer 14b and a second structure layer 16b. Namely, the nitride semiconductor epitaxial wafer 1a is structured such that the dislocation propagation direction changing layer 14a, the second structure layer 16a, the dislocation propagation direction changing layer 14b and the second structure layer 16b are, in this order, sequentially laminated on the first structure layer 12. In other words, the nitride semiconductor epitaxial wafer 1a has the structure that the dislocation propagation direction changing layer and the second structure layer are alternately laminated by two periods on the first structure layer 12.

Alternatively, a nitride semiconductor epitaxial wafer in a modification of the second embodiment can have more than two laminate structures between the first structure layer 12 and the buffer layer 20. Namely, the nitride semiconductor epitaxial wafer in the modification of the second embodiment can be structured such that the dislocation propagation direction changing layer and the second structure layer are alternately laminated by n-periods (n is an integer) between the first structure layer 12 and the buffer layer 20.

Third Embodiment

Figure 4:
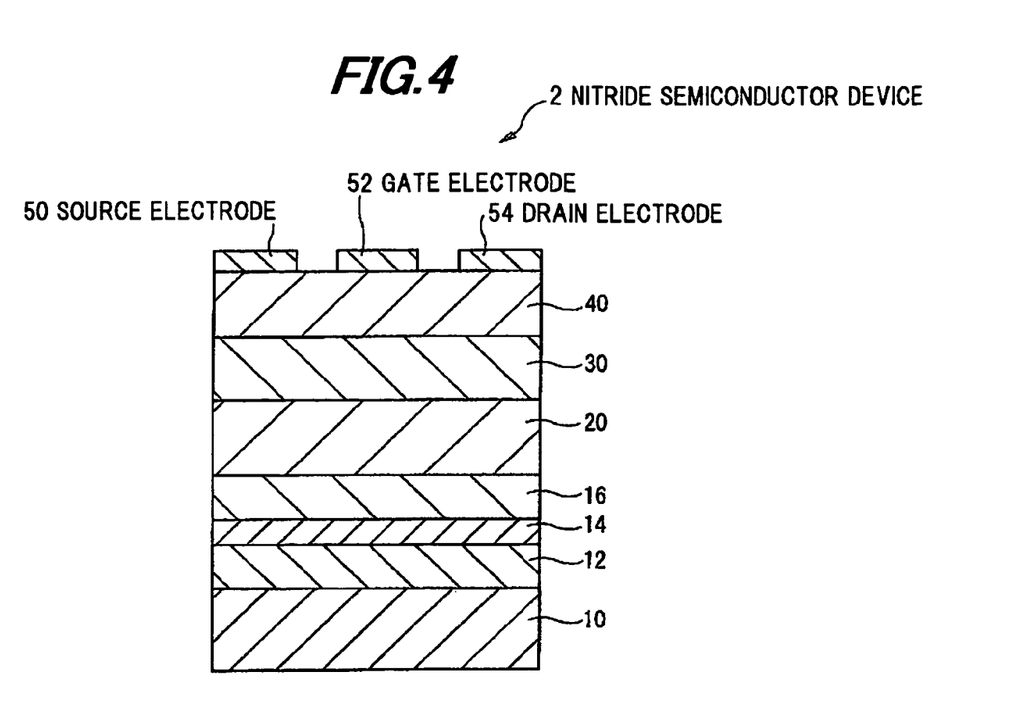
FIG. 4 is a schematic cross section view showing a nitride semiconductor device in a third preferred embodiment of the invention.

FIG. 4 is a schematic cross section view showing a nitride semiconductor device in the third preferred embodiment of the invention.

A nitride semiconductor device 2 of the third embodiment, which is a semiconductor device made by using the nitride semiconductor epitaxial wafer 1 of the first embodiment, has the same semiconductor laminate structure as the nitride semiconductor epitaxial wafer 1 of the first embodiment except its electrode structure. Thus, detailed explanations will be omitted except difference.

The nitride semiconductor device 2 is, as an example, a high-frequency nitride semiconductor transistor. The nitride semiconductor device 2 is composed of a source electrode 50, a gate electrode 52 and a drain electrode 54 on the surface of the supply layer 40. The source electrode 50, the gate electrode 52 and the drain electrode 54 are each formed of at least one selected from metal materials such as Ti, Al, Ni, Au etc. The source electrode 50, the gate electrode 52 and the drain electrode 54 can be formed by, e.g., electron beam deposition, sputtering etc.

EXAMPLES

Example 1

Figure 5:
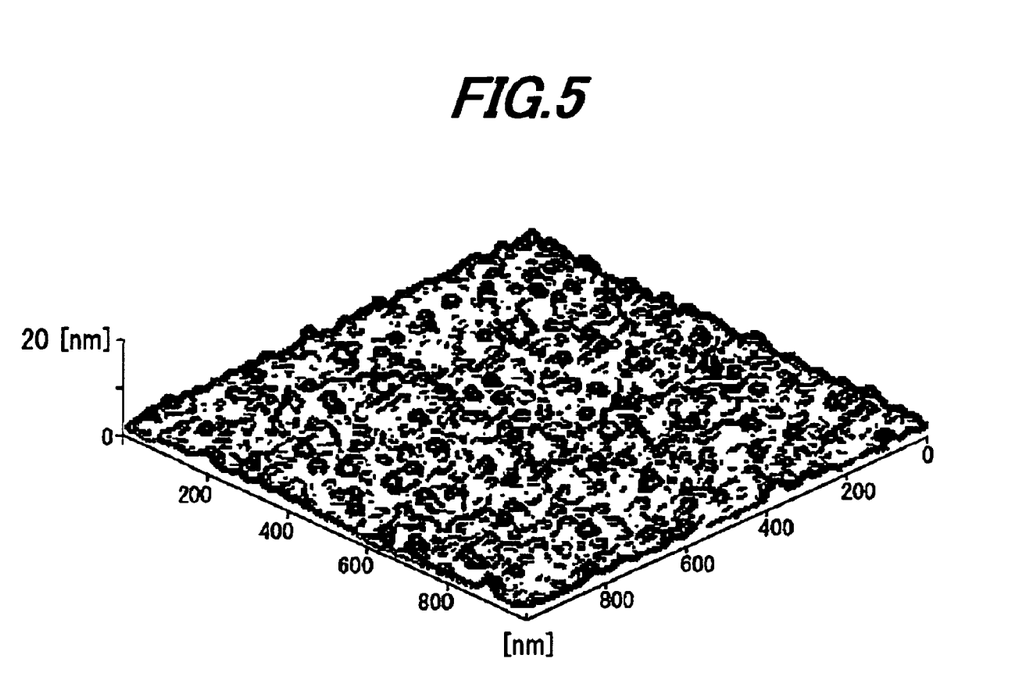
FIG. 5 is an illustration showing an AFM measurement result of a surface of a first structure layer in Example 1 of the invention.

FIG. 5 is an illustration showing an AFM measurement result of a surface of a first structure layer in Example 1 of the invention.

In Example 1 of the invention, a 50 nm thick AlN layer as the first structure layer 12 was grown on a semi-insulating SiC substrate as the growth substrate 10. As a result, as shown in FIG. 5, it was confirmed that plural three-dimensional structures with a height of about 4 to 5 nm were formed in the range of 1 μm×1 μm. Meanwhile, the height is preferably not less than 3 nm and not more than 10 nm in order to have the effects of the invention.

Then, on the AlN layer, a 10 nm thick GaN layer as the dislocation propagation direction changing layer 14, a 50 nm thick AlN layer as the second structure layer 16 and a 2000 nm thick i-GaN layer as the buffer layer 20 were grown in this order (Example 1). Alternatively, on the AlN layer, a 10 nm thick GaN layer as the dislocation propagation direction changing layer 14, a 5 nm thick AlN layer as the second structure layer 16 and a 2000 nm thick i-GaN layer as the buffer layer 20 were grown in this order (Comparative Example 1).

Figure 6A:
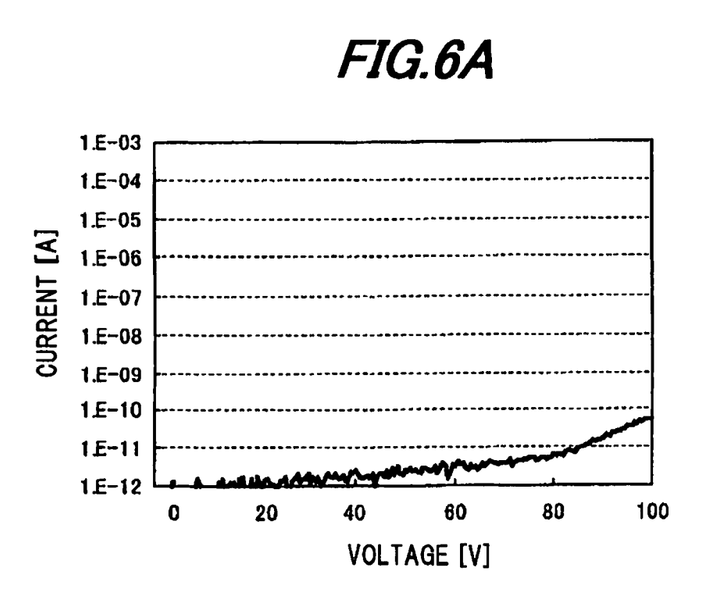
FIG. 6A is a graph showing current-voltage (I-V) characteristics of a nitride semiconductor epitaxial wafer in Example 1 of the invention.
Figure 6B:
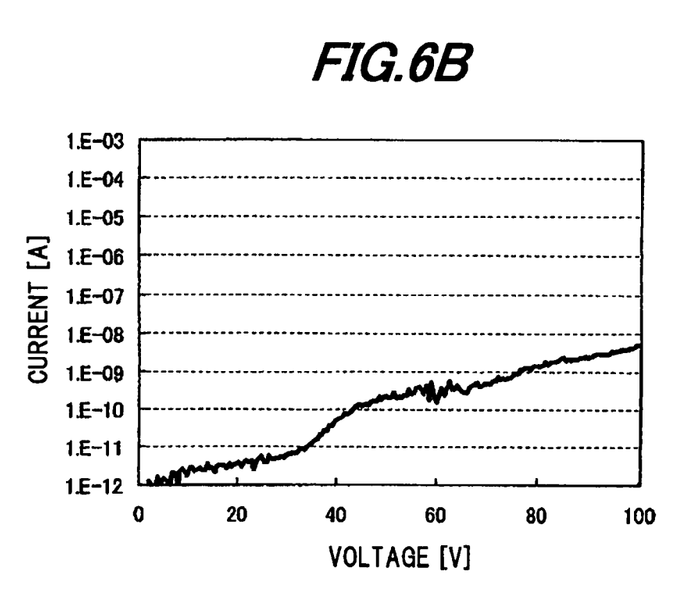
FIG. 6B is a graph showing current-voltage (I-V) characteristics of a nitride semiconductor epitaxial wafer in Comparative Example 1.

FIG. 6A shows the current-voltage (I-V) characteristics of the nitride semiconductor epitaxial wafer in Example 1 of the invention, and FIG. 6B shows the current-voltage (I-V) characteristics of the nitride semiconductor epitaxial wafer in Comparative Example 1.

As shown in FIG. 6A, in the nitride semiconductor epitaxial wafer of Example 1, any kink was not generated in the voltage range of 0 V to 100 V. In contrast, as shown in FIG. 6B, in the nitride semiconductor epitaxial wafer of Comparative Example 1, a kink was generated at around 40 V and much leak current was caused at around 100 V. Thus, the AlN layer as the second structure layer 16 should be formed more than 5 nm in thickness. By the same token, the first structure layer 12 should be formed more than 5 nm in thickness.

In order to suppress generation of the kink and increase of the leak current, excessive thinning (e.g., thickness of not more than 5 nm) of the thickness of the first structure layer 12 and the second structure layer 16 should be avoided. In addition, the first structure layer 12 and the second structure layer 16 should be each formed not more than 50 nm in thickness, so that the first structure layer 12 and the second structure layer 16 are each formed including the three-dimensional structure. Further, in order to reduce the amount of threading dislocation while suppressing generation of the kink and increase of the leak current, the first structure layer 12 and the second structure layer 16 are each formed desirably in the range of not less than 20 nm and not more than 50 nm in thickness.

Table 1 shows the number of threading dislocations in the nitride semiconductor epitaxial wafer of Example 1 of the invention and that of the nitride semiconductor epitaxial wafer of Comparative Example 2.

TABLE 1

| | Number of threading dislocations (/cm$^2$) |
|---|---|
| Example 1 | $3.6 \times 10^8$ |
| Comparative Example 2 | $1.6 \times 10^9$ |

Meanwhile, the nitride semiconductor epitaxial wafer of Comparative Example 2 has the structure that the dislocation propagation direction changing layer 14 and the second structure layer 16 are omitted from the nitride semiconductor epitaxial wafer of Example 1.

Referring to Table 1, the number of threading dislocations in the nitride semiconductor epitaxial wafer of Example 1 was $3.6 \times 10^8$/cm$^2$, and that in the nitride semiconductor epitaxial wafer of Comparative Example 2 was $1.6 \times 10^9$/cm$^2$. Thus, it was confirmed that the number of threading dislocations was significantly reduced in the nitride semiconductor epitaxial wafer in Example 1.

Example 2

Figure 7:
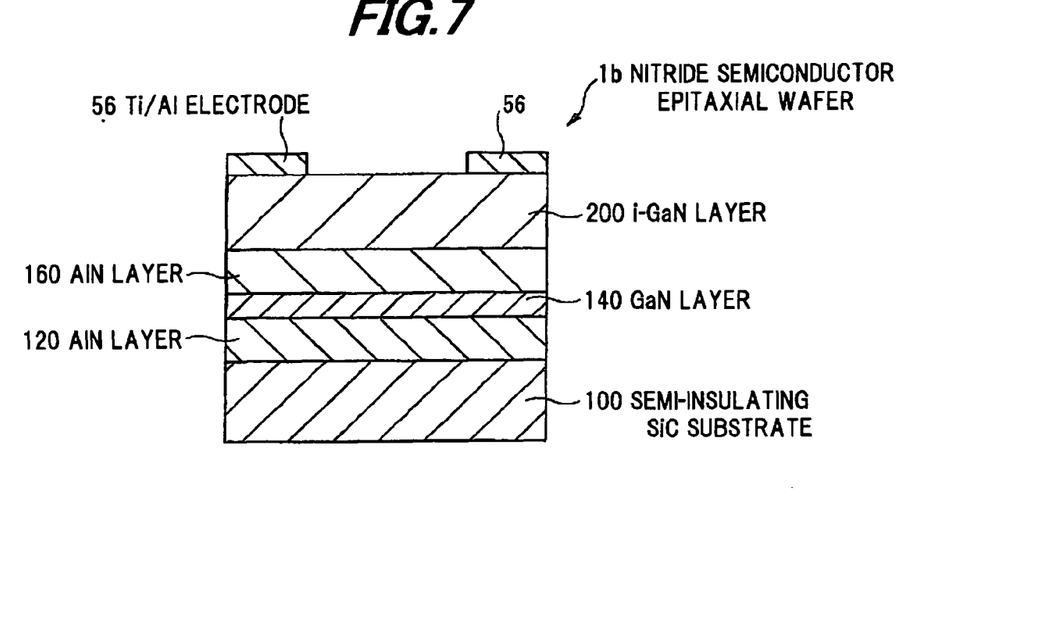
FIG. 7 is a schematic cross sectional view showing a nitride semiconductor epitaxial wafer in Example 2 of the invention.

FIG. 7 is a schematic cross sectional view showing a nitride semiconductor epitaxial wafer in Example 2 of the invention.

The nitride semiconductor epitaxial wafer 1b in Example 2 has a supply layer-free structure for measuring the leak current. Namely, the nitride semiconductor epitaxial wafer 1b is composed of a semi-insulating SiC substrate 100 as the growth substrate 10, a 50 nm thick AlN layer 120 as the first structure layer 12 formed on the semi-insulating SiC substrate 100, a 10 nm thick GaN layer 140 as the dislocation propagation direction changing layer 14 formed on the AlN layer 120, a 50 nm thick AlN layer 160 as the second structure layer 16 formed on the GaN layer 140, a 2000 nm thick i-GaN layer 200 as the buffer layer 20 formed on the AlN layer 160, and a Ti/Al electrode 56 formed at a predetermined area on the surface of the i-GaN layer by vapor deposition.

Alternatively, as a nitride semiconductor epitaxial wafer 1b' in Comparative Example 3, a wafer structured such that the GaN layer 140 and the AlN layer 160 are omitted from the nitride semiconductor epitaxial wafer in Example 2 was formed. Leak current of the nitride semiconductor epitaxial wafers 1b, 1b' in Example 2 and Comparative Example 3, respectively, thus structured was measured in the voltage range of 0 V to 100 V.

Figure 8:
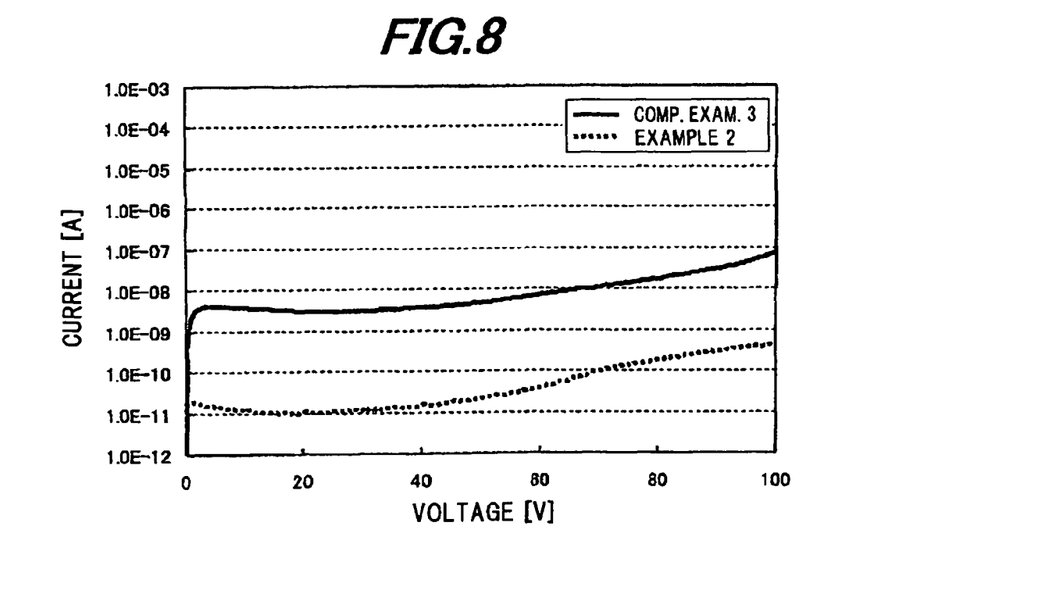
FIG. 8 is a graph for comparing leak current between nitride semiconductor epitaxial wafers in Example 2 of the invention and Comparative Example 3.

FIG. 8 is a graph for comparing leak current between nitride semiconductor epitaxial wafers in Example 2 of the invention and Comparative Example 3 (as abbreviated "COMP. EXAM. 3" in FIG. 8).

As shown in FIG. 8, leak current of the nitride semiconductor epitaxial wafer 1b' in Comparative Example 3 was about $5 \times 10^{-9}$ A to $1 \times 10^{-7}$ A. In contrast, in the nitride semiconductor epitaxial wafer 1b in Example 2, leak current was reduced by two digits as compared to Comparative Example 3, which exhibits values at the level of $1.0 \times 10^{-11}$ A to $1.0 \times 10^{-10}$ A.

Modifications

Modifications in Examples of the invention may include a nitride semiconductor epitaxial wafer with the following structures.

Modification 1

A nitride semiconductor epitaxial wafer having the structure that a 50 nm thick AlN layer as the first structure layer 12, a 100 nm thick GaN layer as the dislocation propagation direction changing layer 14, a 50 nm thick $Al_{(0 \to 1)}Ga_{(1 \to 0)}N$ layer (where Al composition gradually increases from 0 to 1.0 in a direction from the dislocation propagation direction changing layer 14 to the buffer layer 20) as the second structure layer 16, and a 2000 nm thick i-GaN layer as the buffer layer 20 are, in this order, sequentially laminated on a semi-insulating SiC substrate as the growth substrate 10.

Modification 2

A nitride semiconductor epitaxial wafer having the structure that a 50 nm thick AlN layer as the first structure layer 12, a 100 nm thick GaN layer as the dislocation propagation direction changing layer 14, a 50 nm thick $Al_{(1 \to 0)}Ga_{(0 \to 1)}N$ layer (where Al composition gradually decreases from 1.0 to 0 in a direction from the dislocation propagation direction changing layer 14 to the buffer layer 20) as the second structure layer 16, and a 2000 nm thick i-GaN layer as the buffer layer 20 are, in this order, sequentially laminated on a semi-insulating SiC substrate as the growth substrate 10.

Modification 3

A nitride semiconductor epitaxial wafer having the structure that a 50 nm thick AlN layer as the first structure layer 12, a 200 nm thick GaN layer as the dislocation propagation direction changing layer 14, a 50 nm thick AlN layer as the second structure layer 16, and a 2000 nm thick i-GaN layer as the buffer layer 20 are, in this order, sequentially laminated on a semi-insulating SiC substrate as the growth substrate 10. In Modification 3, in order to suppress generation of the two-dimensional electron gas, a p-type dopant layer containing a predetermined p-type impurity such as Mg etc. at a predetermined concentration (i.e., $1 \times 10^{14}$ to $1 \times 10^{17}$ $cm^{-3}$) is further formed between the dislocation propagation direction changing layer 14 and the second structure layer 16. Thereby, it is possible to prevent generation of the two-dimensional electron gas. Alternatively, a nitride semiconductor epitaxial wafer in another example of Modification 3 may have an n-type SiC substrate as the growth substrate 10. In case of using the nitride semiconductor epitaxial wafer in another example of Modification 3 for an electronic device in power application etc., device characteristics may not be substantially affected even when the two-dimensional electron gas is generated between the dislocation propagation direction changing layer 14 and the second structure layer 16. In this case, it is not necessary to form the p-type dopant layer.

Modification 4

A nitride semiconductor epitaxial wafer having the structure that a 50 nm thick AlN layer as the first structure layer 12, a structure laminated by three periods (or three pairs) of laminate structures each including a 100 nm thick GaN layer as the dislocation propagation direction changing layer 14 and a 50 nm thick AlN layer as the second structure layer 16, and a 2000 nm thick i-GaN layer as the buffer layer 20 are, in this order, sequentially laminated on a semi-insulating SiC substrate as the growth substrate 10.

Modification 5

A nitride semiconductor epitaxial wafer having the structure that a 50 nm thick AlN layer as the first structure layer 12, a 100 nm thick GaN layer as the dislocation propagation direction changing layer 14, a 50 nm thick $Al_{0.1}Ga_{0.9}N$ layer as the second structure layer 16, and a 2000 nm thick i-GaN layer as the buffer layer 20 are, in this order, sequentially laminated on a semi-insulating SiC substrate as the growth substrate 10.

Modification 6

A nitride semiconductor epitaxial wafer having the structure that a 50 nm thick AlN layer as the first structure layer 12, a 100 nm thick GaN layer as the dislocation propagation direction changing layer 14, a 10 nm thick $Al_{0.2}Ga_{0.8}N$, a 10 nm thick $Al_{0.4}Ga_{0.6}N$, a 10 nm thick $Al_{0.6}Ga_{0.4}N$, a 10 nm thick $Al_{0.8}Ga_{0.2}N$, and a 10 nm thick AlN which vary stepwise in Al composition as the second structure layer 16, and a 2000 nm thick i-GaN layer as the buffer layer 20 are, in this order, sequentially laminated on a semi-insulating SiC substrate as the growth substrate 10.

Modification 7

A nitride semiconductor epitaxial wafer having the structure that a 50 nm thick AlN layer as the first structure layer 12, a 100 nm thick GaN layer as the dislocation propagation direction changing layer 14, a 50 nm thick AlN layer as the second structure layer 16, and a 2000 nm thick i-GaN layer as the buffer layer 20 are, in this order, sequentially laminated on an n-type SiC substrate as the growth substrate 10.

Modification 8

A nitride semiconductor epitaxial wafer having the structure that a 50 nm thick AlN layer as the first structure layer 12, a 10 nm thick GaN layer as the dislocation propagation direction changing layer 14, an InGaN layer with a predetermined thickness, a 50 nm thick AlN layer as the second structure layer 16, and a 2000 nm thick i-GaN layer as the buffer layer 20 are, in this order, sequentially laminated on a semi-insulating SiC substrate as the growth substrate 10.

Modification 9

A nitride semiconductor epitaxial wafer having the structure that a 50 nm thick AlN layer as the first structure layer 12, an InGaN layer with a predetermined thickness, a 10 nm thick GaN layer as the dislocation propagation direction changing layer 14, a 50 nm thick AlN layer as the second structure layer 16, and a 2000 nm thick i-GaN layer as the buffer layer 20 are, in this order, sequentially laminated on a semi-insulating SiC substrate as the growth substrate 10.

Modification 10

A nitride semiconductor epitaxial wafer having the structure that a 50 nm thick $Al_xGa_{1-x}N$ layer ($0<x\leq1$) as the first structure layer 12, a 10 nm thick GaN layer as the dislocation propagation direction changing layer 14, a 50 nm thick AlN layer as the second structure layer 16, and a 2000 nm thick i-GaN layer as the buffer layer 20 are, in this order, sequentially laminated on a semi-insulating SiC substrate as the growth substrate 10.

Although the invention has been described, the invention according to claims is not to be limited by the above-mentioned embodiments and examples. Further, please note that not all combinations of the features described in the embodiments and the examples are necessary to solve the problem of the invention.

What is claimed is:

1. A nitride semiconductor epitaxial wafer, comprising:
   a growth substrate comprising a surface for growing a nitride semiconductor thereon;
   a first structure layer formed on the growth substrate;
   a dislocation propagation direction changing layer formed on the first structure layer for changing a propagation direction of a dislocation propagated in the first structure layer into a lateral direction;
   a second structure layer formed on the dislocation propagation direction changing layer; and
   a buffer layer formed on the second structure layer for changing a propagation direction of a dislocation propagated in the second structure layer,
   wherein the first and second structure layers each comprise a three-dimensional structure, and
   the dislocation propagation direction changing layer and the buffer layer each change the propagation direction of the dislocation at a surface of the three-dimensional structure.

2. The nitride semiconductor epitaxial wafer according to claim 1, wherein
   the dislocation propagation direction changing layer is grown in the lateral direction.

3. The nitride semiconductor epitaxial wafer according to claim 1, wherein
   the first structure layer is formed 5 nm to 50 nm in thickness, and
   the second structure layer is formed 5 nm to 50 nm in thickness.

4. The nitride semiconductor epitaxial wafer according to claim 1, wherein
   the dislocation propagation direction changing layer is formed less than 100 nm in thickness.

5. The nitride semiconductor epitaxial wafer according to claim 1, wherein
   the first structure layer comprises AlN,
   the dislocation propagation direction changing layer comprises GaN,
   the second structure layer comprises a nitride semiconductor containing aluminum (Al), and
   the buffer layer comprises GaN.

6. The nitride semiconductor epitaxial wafer according to claim 5, wherein
   the second structure layer comprises $Al_xGa_{(1-x)}N(0<x\leq1)$, and
   the dislocation propagation direction changing layer comprises GaN.

7. The nitride semiconductor epitaxial wafer according to claim 1, wherein
   the growth substrate comprises a SiC or GaN single crystal.

8. The nitride semiconductor epitaxial wafer according to claim 1, wherein
   two laminate structures, each of which comprising a lamination of the dislocation propagation direction changing layer and the second structure layer, are formed between the first structure layer and the buffer layer.

9. The nitride semiconductor epitaxial wafer according to claim 1, wherein
   the dislocation propagation direction changing layer comprises InGaN or AlGaN.

10. A nitride semiconductor device, comprising the nitride semiconductor epitaxial wafer according to claim 1 and an electrode formed thereon.

11. A nitride semiconductor epitaxial wafer, comprising:
    a growth substrate comprising a surface for growing a nitride semiconductor thereon;
    a first structure layer formed on the growth substrate;
    a dislocation propagation direction changing layer formed on the first structure layer for changing a propagation direction of a dislocation propagated in the first structure layer into a lateral direction;
    a second structure layer formed on the dislocation propagation direction changing layer; and
    a buffer layer formed on the second structure layer for changing a propagation direction of a dislocation propagated in the second structure layer,
    wherein the second structure layer comprises an $Al_xGa_{(1-x)}N(0<x\leq1)$ composition change layer that Al composition ratio thereof decreases in a direction from the dislocation propagation direction changing layer to the buffer layer.

12. A nitride semiconductor epitaxial wafer, comprising:
    a growth substrate comprising a surface for growing a nitride semiconductor thereon and a SiC or GaN single crystal;
    a first structure layer formed on the growth substrate and comprising AlN and a three-dimensional structure;
    a dislocation propagation direction changing layer comprising GaN and formed directly on the first structure layer for changing a propagation direction of a dislocation propagated in the first structure layer into a lateral direction;
    a second structure layer formed on the dislocation propagation direction changing layer and comprising AlN and a three-dimensional structure;
    a buffer layer comprising GaN and formed on the second structure layer for changing a propagation direction of a dislocation propagated in the second structure layer;
    a channel layer formed on the buffer layer; and
    a supply layer formed on the channel layer.

13. A nitride semiconductor device, comprising the nitride semiconductor epitaxial wafer according to claim 12 and an electrode formed thereon.

* * * * *